United States Patent
Mimlitch, III et al.

(10) Patent No.: US 9,645,181 B2
(45) Date of Patent: May 9, 2017

(54) AQUATIC TOY

(71) Applicant: Innovation First, Inc., Greenville, TX (US)

(72) Inventors: Robert H. Mimlitch, III, Rowlett, TX (US); David A. Norman, Greenville, TX (US); Raul Olivera, Greenville, TX (US); James Anthony Trzaskos, Greenville, TX (US)

(73) Assignee: Innovation First, Inc., Greenville, TX (US)

( * ) Notice: Subject to any disclaimer, the term of this patent is extended or adjusted under 35 U.S.C. 154(b) by 0 days.

(21) Appl. No.: 14/180,154

(22) Filed: Feb. 13, 2014

(65) Prior Publication Data

US 2015/0224413 A1    Aug. 13, 2015

(51) Int. Cl.
| | |
|---|---|
| *A63H 23/00* | (2006.01) |
| *A63H 23/04* | (2006.01) |
| *A63H 23/10* | (2006.01) |
| *G01R 27/02* | (2006.01) |

(52) U.S. Cl.
CPC ............. *G01R 27/02* (2013.01); *A63H 23/00* (2013.01); *A63H 23/04* (2013.01); *A63H 23/10* (2013.01)

(58) Field of Classification Search
CPC ........ A63H 23/00; A63H 23/04; A63H 23/10; A63H 23/14; A63H 29/22; A63H 31/02
See application file for complete search history.

(56) References Cited

U.S. PATENT DOCUMENTS

| | | | |
|---|---|---|---|
| 1,928,418 A | 9/1933 | Garland | |
| 2,511,154 A | 6/1950 | Garland | |
| 2,645,883 A | 7/1953 | De Salvo | |
| 2,909,868 A | 10/1959 | Lewis | |
| 4,314,423 A * | 2/1982 | Lipsitz | A63H 13/00 340/384.3 |
| 4,687,456 A | 8/1987 | Wang | |
| 4,832,650 A * | 5/1989 | Tong | A63H 23/14 43/26.2 |
| 5,344,357 A * | 9/1994 | Lyczek | A63H 23/10 446/154 |
| 5,480,331 A | 1/1996 | Lewis | |

(Continued)

OTHER PUBLICATIONS

Co-pending PCT Application US2015.015552 Written Opinion of the ISA; May 19, 2015.

(Continued)

*Primary Examiner* — Alvin Hunter
*Assistant Examiner* — Alyssa Hylinski
(74) *Attorney, Agent, or Firm* — Adam K. Sacharoff; Much Shelist

(57) ABSTRACT

In one embodiment there is provided an aquatic toy configured for movement under water. The aquatic toy employs sensors to automatically turn on when placed in water and further employs a timing circuit to automatically turn the toy off after a predetermined amount of time. The aquatic toy further includes a shock sensor to monitor movement of the toy when in water and after the timer expires. Movement such as tapping on the tank, splashing the water, or physical movement of the toy will turn on the toy and re-activate the timer. However, the sensors can further detect when the toy is dry to ensure the shock sensor is only active when the sensor is wet.

3 Claims, 5 Drawing Sheets

(56) References Cited

U.S. PATENT DOCUMENTS

| | | | | |
|---|---|---|---|---|
| 5,697,182 | A | * | 12/1997 | Rodgers ................ A01K 85/01 43/17.1 |
| 5,876,108 | A | * | 3/1999 | Chien .................... B60Q 1/326 362/103 |
| 5,903,212 | A | * | 5/1999 | Rodgers ............ H05B 33/0845 340/309.3 |
| 5,989,091 | A | * | 11/1999 | Rodgers ................ A01K 85/01 200/184 |
| 6,138,604 | A | | 10/2000 | Anderson et al. |
| 6,860,785 | B2 | | 3/2005 | Vap |
| 8,621,776 | B2 | * | 1/2014 | Thomas ................ A01K 85/01 43/17.1 |
| 2004/0092200 | A1 | * | 5/2004 | Ishimoto ................ A63H 23/04 446/153 |
| 2006/0009116 | A1 | * | 1/2006 | Vap ........................ A63H 23/00 446/330 |
| 2006/0196104 | A1 | * | 9/2006 | Lapointe ................ A63H 11/00 43/42.24 |
| 2013/0017754 | A1 | | 1/2013 | Lu |
| 2013/0067792 | A1 | * | 3/2013 | Thomas ................ A01K 85/00 43/26.2 |

OTHER PUBLICATIONS

Damian Isla, Robotuna Project to Model Real Fish, The Tech, vol. 115, Issue 49, Oct. 17, 1995, Online Edition.

BBC News, Sci/Tech Robot Fish to Resurrect Fossils, BBC News Feb. 25, 1999, Online Network.

Yuuzi Terada, Ikuo Yamamoto, Development of Oscillating Fin Propulsion System and Its Application to Ships and Artificial Fish, Technical Review, vol. 36, No. 3, Oct. 1999.

Michael S. Triantafyllou and George S. Triantafyllou, An Efficient Swimming Machine, Scientific American Mar. 1995.

Amy Higgins, Dual Blade Swim Fins Have Divers Kicking with Ease, Machine Design, Oct. 19, 2000.

David Scott Barrett, The Design of a Flexible Hull Undersea Vehicle Propelled by an Oscillating Foil, BSME University of Lowell, Massachusetts Institute of Technology Dept. of Ocean Engineering, May 6, 1994.

Charlie I, Design of the MIT RoboTuna, Sep. 19, 2004, Website.

VCUUV- Vehicle Systems, Draper Laboratory, 1999.

Christopher D. Gadda, Robust Control of a Flexible-Hull Propulsion System, Massachusetts Institute of Technology, May 22, 1998.

Gold Water Technology, Inc., webpage 2000.

* cited by examiner

AQUATIC TOY

FIELD OF TECHNOLOGY

The present invention relates to aquatic toys.

BACKGROUND OF THE INVENTION

Aquatic toys are well known in the industry. The prior art is riddled with aquatic mechanical looking fish and other aquatic animals that use various mechanics to create oscillating motion of a fin to move the fish in water. Various other attributes may be used to either keep the fish floating or allow the fish to sink in the water. More recently, aquatic toys have employed conductive sensors that activate the movement of the fin(s) as soon as the toy is placed in the water. In these cases, the fish must be taken out of the water and dried to get the fish to stop moving. If left in the water the aquatic toy would run the battery dead before stopping. One aspect adopted by the present invention includes a timer to automatically turn the battery off after running for a predetermined amount of time. However, it was determined that once the battery was automatically turned off, the ability to restart the aquatic toy still required the toy to be removed, dried, and then re-inserted into the water. As such, there is a desire to employ a means to re-start the aquatic toy after the battery has been turned off.

An aspect of the feature, to turn the aquatic toy back on, ended up in a manner that would appear to exponentially increase a child's enjoyment with the toy. As one can imagine when a child approaches a fish tank with a non-moving fish, the child instinctively wants to either tap the tank, splash the water near the fish, or physically touch the fish. However, the child is most likely ingrained with thoughts that any one of those instincts is wrong. Children are always taught not to tap the tank, and most likely are not given the access to physically touch the fish or splash the water. Nevertheless, the means to re-start the aquatic toy in accordance with an embodiment of the present invention is exactly what the child most wants to do. As such, to re-start the aquatic toy, the user can do one or more of the following: tap the tank, splash the water, or physically touch the fish.

SUMMARY OF THE INVENTION

The summary of an aspect of the invention is defined by having a method of moving an aquatic toy. The method is defined by having a body with a propelling mechanism to propel the body when placed in a liquid. The method further provides for a control circuit in communication with the propelling mechanism, which is configured to activate the control circuit to propel the body and deactivate the control circuit to turn off the propelling mechanism. The method also monitors conductivity to activate the control circuit when a portion of the body or a sensor pad is wet and to deactivate the control circuit when the portion of the body or sensor pad is dry. When activated the control circuit is timed, such that the control circuit can be deactivated when it has been activated for a predetermined amount of time. Lastly, movement of the body is monitored such that the control circuit can be activated when a portion of the body is wet, when the control circuit has been deactivated because the timer has reached the predetermined amount of time, and when movement has been detected.

In another aspect an aquatic toy in accordance with an embodiment of the present invention is provided to include a body having a propelling mechanism to propel the toy when placed in a liquid. A control circuit is further provided to activate and deactivate the propelling mechanism. A conductivity sensor is employed and configured to activate the control circuit when the conductivity sensor is wet and further configured to deactivate the control circuit when the conductivity sensor is dry. A timing circuit is configured to activate when the conductivity sensor is wet, the timing circuit when activated is configured to deactivate the control circuit when the timing circuit is activated for a predetermined amount of time. Lastly, a shock sensor is provided and configured to monitor movement of the body. The shock sensor is further configured to activate the control circuit only when the conductivity sensor is wet, when the timing circuit has reached the predetermined amount of time, and when movement has been detected, thereby reactivating the movement of the body.

Numerous other advantages and features of the invention will become readily apparent from the following detailed description of the invention and the embodiments thereof, from the claims, and from the accompanying drawings.

BRIEF DESCRIPTION OF THE DRAWINGS

The invention will be further described with reference to the accompanying drawings and embodiment.

DETAILED DESCRIPTION OF THE INVENTION

Figure 1:
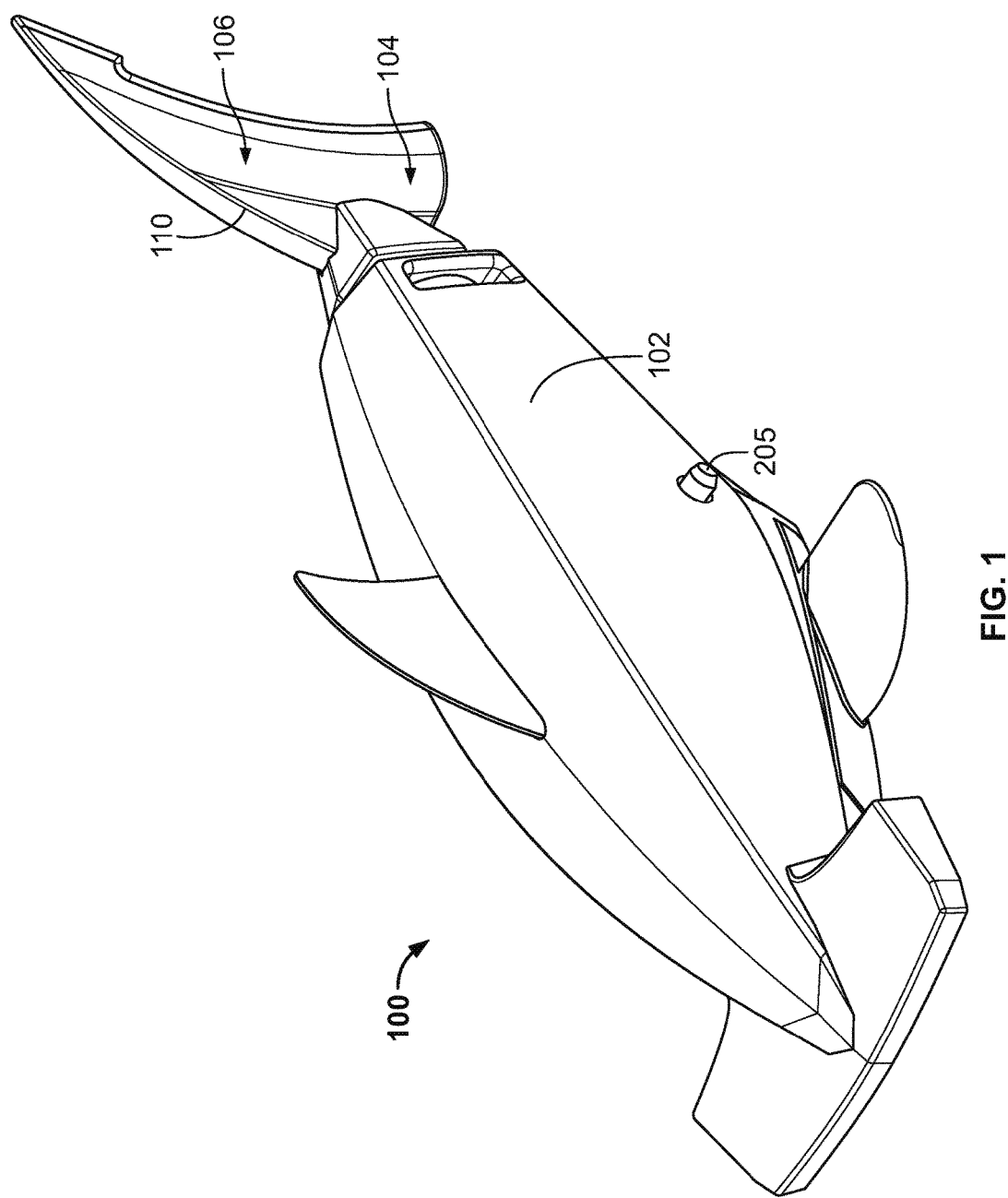
FIG. 1 is a perspective view of an aquatic toy in accordance with one embodiment of the present invention.
Figure 2:
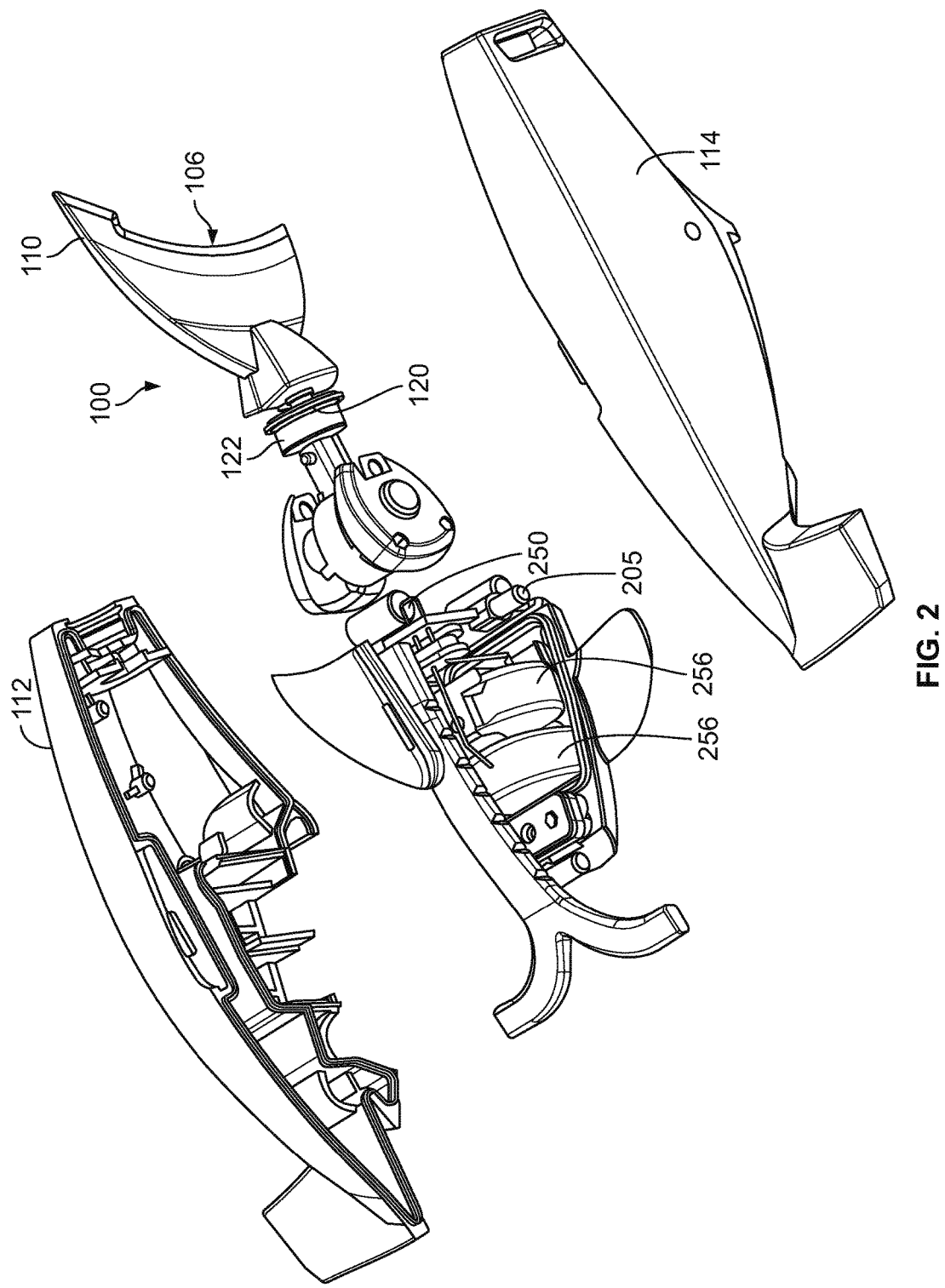
FIG. 2 is a partial exploded view of an aquatic toy in accordance with one embodiment of the present invention.
Figure 3:
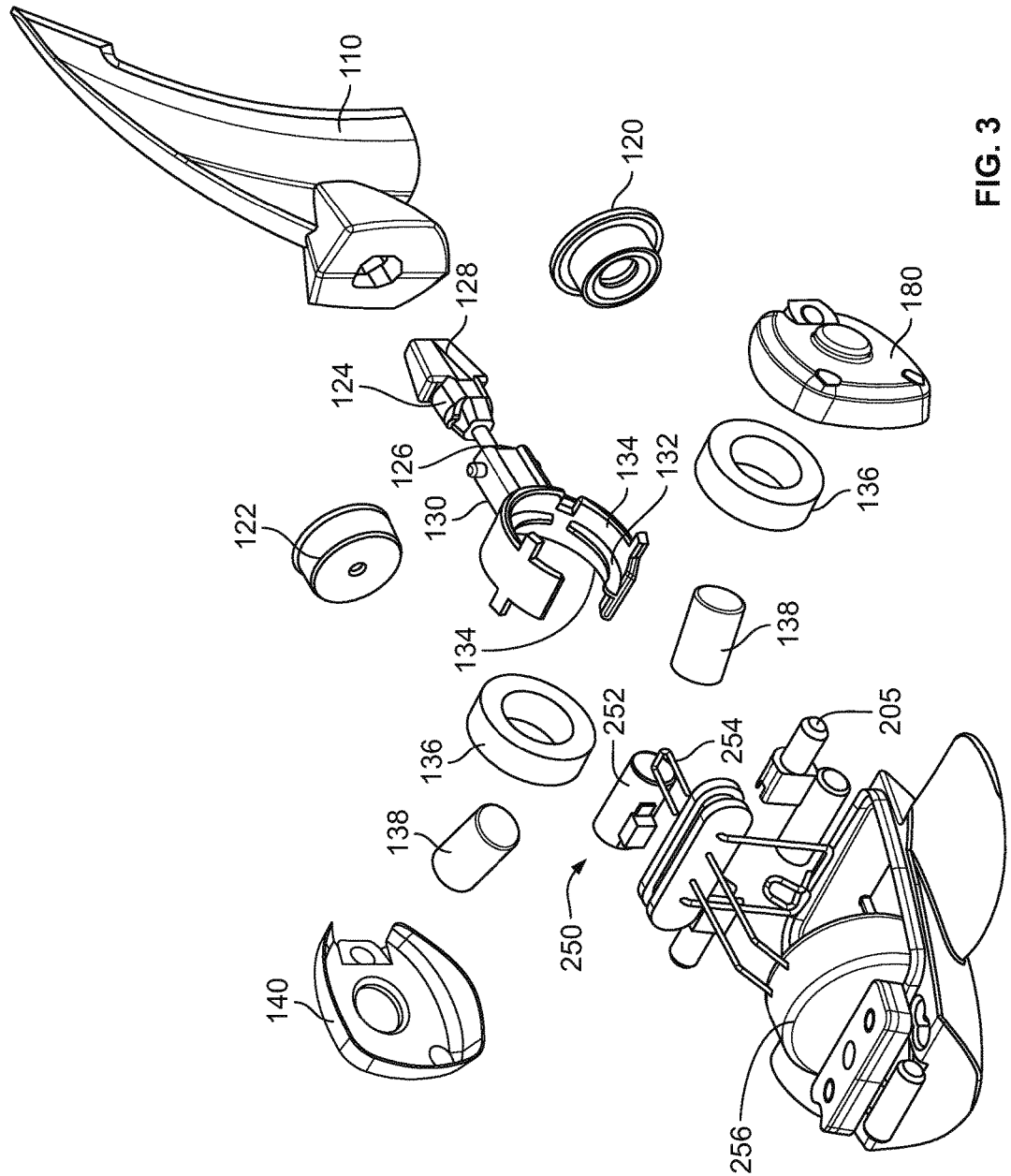
FIG. 3 is a partial exploded view of various components of an aquatic toy in accordance with one embodiment of the present invention.
Figure 4:
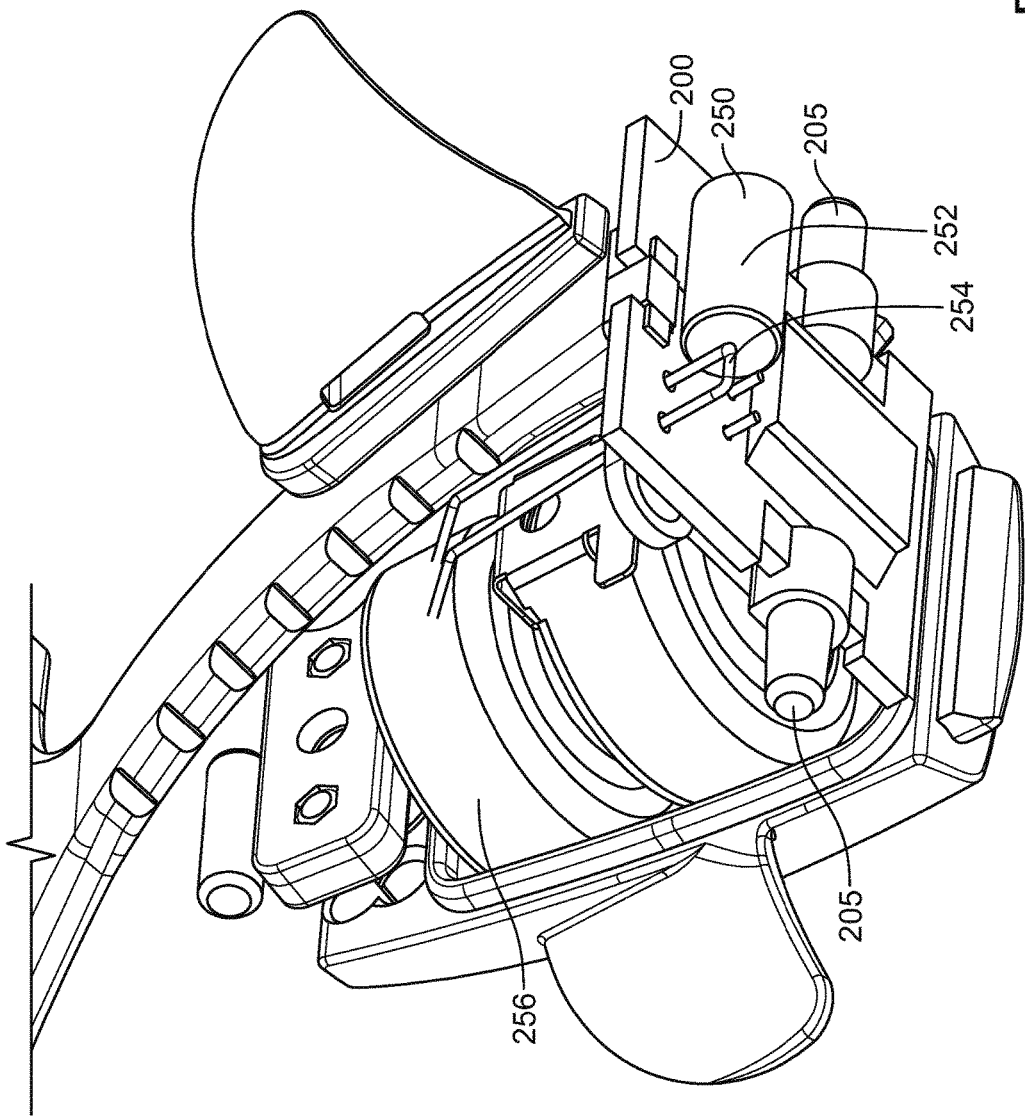
FIG. 4 is an enlarged view of various internal components of an aquatic toy in accordance with one embodiment of the present invention.

Referring now to FIGS. 1 through 4, there is shown an aquatic toy taking the form of a shark. As is well within the scope of the invention, the form of the toy is not important to the invention, as the outer shell can be changed as desired. The aquatic toy 100 includes a body assembly 102 that houses the internal components and further includes a propelling mechanism 104, preferably in the form of a tail assembly 106. The tail assembly 106 is engaged or integrally formed with the body assembly 102. The aquatic toy may be neutrally buoyant, configured to sink within a tank of water, or preferably positively buoyant to provide a simple means of retrieving the fish when desired.

The tail assembly 106 includes a tail 110 that can make an oscillatory like motion relative to the body assembly 102 and thereby propel the aquatic toy through the water. The body assembly 102 preferably made from a rigid plastic and the tail 110 from a more flexible plastic. However, alternative appropriate materials may be used.

In one embodiment the body assembly 102 has a left shell 112 and a right shell 114. The tail assembly 106 is pivotally disposed from the body assembly 102. The tail assembly 106 may gain support of both the left shell 112 and right shell 114, with a sealing ring 120 and a support bracket 122. A tail shaft 124 of the tail assembly 106 has an first end 126 and a second end 128. The first end penetrates through a central hole of the sealing ring 120. The second end of the tail shaft 124 attaches to the tail 110.

A coil and magnet arrangement is preferably disposed in the body assembly 102. The coil can be energized to cause the tail to oscillate. In one embodiment the coil and magnet arrangement may include two magnets and one coil, while in other forms there may be one magnet and one coil, or one magnet and two coils. In the illustration, a two magnet and two coil arrangement is shown. In the illustrated present embodiment, a tail coil holder 130 is secured to the first end 126 of the tail shaft 124. The tail coil holder 130 includes an internally positioned central protrusion 132 with flanges 134 extending annually on both sides of the central protrusion 132. A coil 136 is positioned within each of the flanges 134 on either side of the central protrusion 132. Each coil 136 has a corresponding magnet 138 that are separately secured at one end to a magnetic shield 140. Each shield 140 is attached to one of the shells of the body assembly 102. In use, when the coils are energized, magnetic poles are induced in the coils. The magnetic poles interact with the magnetic poles of the magnets to cause the coils to be attracted to one of the magnets and repelled by the other magnet, as the poles are constantly turned on/off or reversed the tail assembly oscillates back and forth between the magnets. Preferably the opposite surfaces of the two magnets are of the same polarity, and the coils are disposed such that the coils central axis is perpendicular to the central horizontal axis through the aquatic toy.

In other embodiments the magnet and coil configuration may be different, but have the same effect. For example, when an alternating current is applied to a coil, an alternating magnetic pole is induced in the coil, that interacts with a single magnet pole, causing the shaft and tail to move. Similarly, when an alternating current is applied to a pair of coils the magnetic poles induced in the coils interact with the poles of the magnet and cause the magnet and thus the shaft to move. The two coil and two magnet arrangement allows for a left, right, and center position. Tail oscillation from left to right causes straight swimming. Tail oscillation from center to right causes a right turn, and center to left causes a left turn.

In one configuration, a circuit board 200 is disposed in the body assembly 102. The circuit board 200 includes a drive control circuit to supply electric current to the coil, the magnetic field induced in the coil interacts with the magnetic field produced by both magnets. This creates an attraction force at one side of the coil and a pushing force at the other side of the coil. This causes the coil and holder 130 to pivot or lean towards one or other magnet, causing the tail shaft 126 to swing. When the current direction is changed, the force directions are changed accordingly and the tail shaft is moved in the opposite direction. Thus with consecutive changes in the current in the coil and changing of the magnetic poles in the coil, the tail shaft swings in an oscillatory manner. The swinging of the tail causes the tail 110 to propel the body assembly 102 forward.

Additionally, in the preferred form of the aquatic toy, an activation circuit is provided for the toy. The activation circuit is associated with the drive control circuit and is provided to activate the energization of the coil(s). The activation circuit is preferably one or more conductivity sensor pads 205. The sensor pads 205 activate the drive control circuit when the placed in water. It has further been determined that in most instances the user once the aquatic toy is placed in the water often will leave the toy unattended, causes the toy to continuously run and drain the battery life.

To increase the enjoyment of the toy, a timing circuit was added to the circuit board to deactivate the drive control circuit after a predetermined amount of time, i.e. 5 minutes. However, the exact amount of time can be changed as desired. The drive control circuit is preferably powered by a power supply 256, i.e. one or more battery(ies).

In most instances to restart the aquatic toy, the toy would have to be removed from the water, dried to reinitiate the conductive sensor pads, and then re-inserted in to the water. However, as noted herein, to increase the enjoyment and play of the aquatic toy, in one embodiment of the invention there is provided a shock sensor 250. The shock sensor 250 detects movement of the aquatic toy 100. In reaction to the detection of movement, the shock sensor 250 sends a signal to the circuit board which will then activate the drive control circuit to move the toy in the water, and reset the timing circuit.

The shock sensor 250 detects movement of the aquatic toy 100 by either (a) having the user tap on the glass to cause a vibration in the water and thus a vibration against the toy; (b) physical movement of the toy, i.e. having the user touch the toy; or (c) splashing the water to cause a vibration of the toy.

In one embodiment, the shock sensor 250 is a metal cam or cylinder 252 with wire(s) or coil 254 placed freely within the metal cam. If the wire touches a side of the metal cam, the sensor is activated. In an aspect of this embodiment, the shock sensor 250 can be used in cooperation with the conductive sensor pad(s) 205, which detects when the toy is in water. Since, it is not preferred to have the shock sensor 250 activate the toy when the toy is not in the water (i.e. during shipping, transport, or movement out of the water), the shock sensor 250 would only be activated when the toy is in water and when the timing circuit has run and turned off the drive control circuit. As such, in one or more aspects, the conductive sensor pad(s) may be tuned to check for a conductivity threshold. Since water has a higher conductivity than air, the sensor pads can determine when the toy is in the water and thus activate the shock sensor 250 only when the toy is positioned in water. Due to the scheme described, the shock sensor only activates the fish when it is in the water and not moving. This allows for a shock sensor that requires very little shock to activate, making it possible to detect the shock of tapping on a variety of tank types and sizes.

The orientation of the shock sensor can be made for either side/side touching and/or up/down touching. This would allow the shock sensor 250 to detect movement across any plane of the toy.

Figure 5:
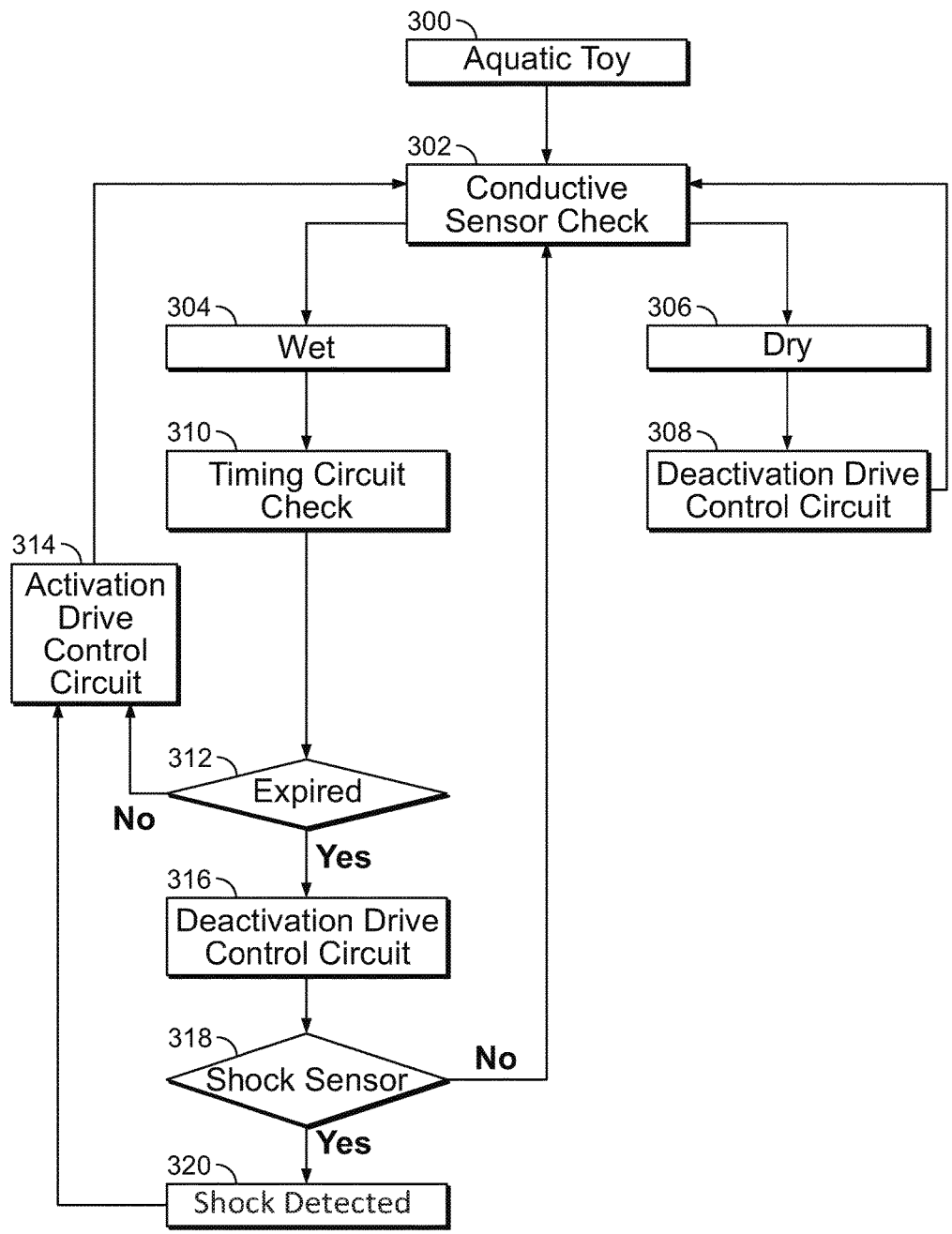
FIG. 5 is a system box diagram of an operational method of an aquatic toy in accordance with one embodiment of the present invention.

Referring now to FIG. 5, there is provided a block diagram of a method of operation for an aquatic toy 300, similarly constructed and configured to the aquatic toy 100. In this method of operation, a conductive sensor 302 checks to determine if the toy or sensor pads are wet 304 or dry 306. If dry, the drive control circuit is deactivated 308, which causes the aquatic toy 300 to stop moving (or remain inactive). This is essence turns off the propelling mechanism incorporated in the aquatic toy. If the sensor pads are wet 304, a timing circuit 310 will be checked against a predetermined value of expiration 312. If the timing circuit determines that its run time has not expired then the drive control is activated 314 (or continues to activate) to allow the aquatic toy to run or move in the water. Should the timing circuit determine that it has expired, then the drive control circuit is deactivated 316. Once the timing circuit expires, the shock sensor 318 will begin monitoring movement of the toy. If movement is detected 320, the drive control circuit will activate 314. However, if movement is not detected then the drive control circuit remains deactivated and the system returns to a conductive sensor check 302.

While this is one example of a method of operation, numerous configurations can be employed which cause the various sensor checks to operate virtually simultaneously but in accordance with the governance that the shock sensor would only activate the drive control circuit, when the sensor pads are wet and when the timing circuit has expired. This prevents the activation of the drive control circuit when the toy is out of the water or prior to the deactivation of the drive control circuit. In other aspects acoustic sensors could be utilized to monitor sounds for the re-activation of the toy. With the use of acoustic sensors an amplifier and microphone would be employed to monitor for tapping on the tank or slapping on the water. The acoustic sensor would be more costly and would present challenges to work for tapping on glass, splashing and touching the fish. Other means of determining the presence of water such as capacitive touch sensing circuits could replace the conductive sensor.

In an embodiment of the present invention there may be provided an aquatic toy having a propelling mechanism to propel the toy when placed in a liquid, a control circuit to control the propelling mechanism, a conductivity sensor, a timing circuit, and a shock sensor. It being well within the scope of the application, that hardware could be replaced by software instructions coded on a circuit board. As such the term circuit and/or sensor could refer to hardware and/or software instructions. The conductivity sensor has a pad and the conductivity sensor is configured to monitor a conductivity of the pad. The conductivity sensor further being in communication with the control circuit. The control circuit has a first set of conductivity instructions configured to activate the propelling mechanism when the conductivity of the pad indicates the pad is in a liquid and the control circuit has a second set of conductivity instructions configured to deactivate the propelling mechanism when the conductivity of the pad indicates the pad is dry. The timing circuit is also in communication with the control circuit. The timing circuit has a set of timing instructions configured to activate when the control circuit activates the propelling mechanism and further configured to instruct the control circuit to deactivate the propelling mechanism when the conductivity of the pad indicates the pad is in a liquid for a predetermined amount of time. Lastly, the shock sensor is also in communication with the control circuit and is configured to either send a shock signal to the control circuit when the body is moved. The control circuit has a set of shock instructions configured to activate the propelling mechanism only after the timing circuit instructs the control circuit to deactivate the propelling mechanism, the conductivity sensor still detects the pad is in a liquid, and when the control circuit receives the shock signal to indicate movement has been detected by the shock sensor.

From the foregoing and as mentioned above, it is observed that numerous variations and modifications may be effected without departing from the spirit and scope of the novel concept of the invention. It is to be understood that no limitation with respect to the embodiments illustrated herein is intended or should be inferred. It is intended to cover, by the appended claims, all such modifications within the scope of the appended claim.

We claim:

1. An aquatic toy comprising:
    a body having a propelling mechanism in communication with a power supply to propel the toy when placed in a liquid;
    a control circuit configured to control the power supply to the propelling mechanism, and further configured to transition the aquatic toy between an activated state and deactivated state based on predetermined instructions;
    a conductivity sensor having a pad, the conductivity sensor being configured to monitor a conductivity of said pad, the conductivity sensor further being in communication with the control circuit, wherein the control circuit has a first set of conductivity instructions configured to transition and maintain the aquatic toy in the activated state when the conductivity of said pad indicates the pad is in a liquid and the control circuit has a second set of conductivity instructions configured to transition and maintain the aquatic toy in the deactivated state when the conductivity of said pad indicates the pad is dry;
    a timing circuit in communication with the control circuit, the timing circuit having a set of timing instructions configured to only transition the aquatic toy from the activated state to the deactivated state when the conductivity of said pad indicates the pad is in a liquid for a predetermined amount of time; and
    a shock sensor in communication with the control circuit and configured to send a shock signal to the control circuit when the body is moved, the control circuit having a set of shock instructions configured to transition the aquatic toy from the deactivated state to the activated state only when the conductivity sensor detects said pad is wet and after the timing circuit transitioned the aquatic toy to the deactivated state and only when the control circuit receives the shock signal to indicate movement has been detected by the shock sensor.

2. The aquatic toy of claim 1, wherein the shock sensor is a metallic cylinder with a wire or coil of wire positioned inside the cylinder, and wherein the shock signal is further defined as the control circuit being configured to monitor when the wire or coil of wire touches an inside portion of the metallic cylinder to indicate movement.

3. The aquatic toy of claim 2, wherein the orientation of the shock sensor is positioned to monitor movement of the aquatic toy across one or more axes of the aquatic toy.

* * * * *